United States Patent [19]

Kato et al.

[11] Patent Number: 5,208,866
[45] Date of Patent: May 4, 1993

[54] ON-BOARD VEHICLE AUTOMATIC SOUND VOLUME ADJUSTING APPARATUS

[75] Inventors: Shinjiro Kato; Hisashi Kihara; Fumio Tamura; Shuichi Mori, all of Kawagoe, Japan

[73] Assignee: Pioneer Electronic Corporation, Tokyo, Japan

[21] Appl. No.: 619,182

[22] Filed: Nov. 27, 1990

[30] Foreign Application Priority Data

Dec. 5, 1989 [JP] Japan .................. 1-316230

[51] Int. Cl.⁵ .............................................. H03G 3/20
[52] U.S. Cl. .................................... 381/107; 381/57; 381/86
[58] Field of Search .................... 381/57, 86, 107, 108

[56] References Cited

U.S. PATENT DOCUMENTS 4,641,344 2/1987 Kasai et al. ............................ 381/57
4,864,246 9/1989 Kato et al. ............................ 381/107
5,081,682 1/1992 Kato et al. ............................ 381/86

FOREIGN PATENT DOCUMENTS 0163545 12/1985 United Kingdom ................... 381/57

Primary Examiner—Jin F. Ng
Assistant Examiner—Edward Lefkowitz
Attorney, Agent, or Firm—Perman & Green

[57] ABSTRACT

AN on-board vehicle automatic sound volume adjusting apparatus which adjusts the level of an input audio signal in accordance with the difference between the input audio signal level and the running noise level inside the vehicle and which compresses the input audio signal in terms of amplitude according to the level difference. The apparatus inhibits the masking of the minimum component in the reproduced sound volume, and prevents the maximum component therein from becoming excessive when the running noise level is raised.

5 Claims, 7 Drawing Sheets

ON-BOARD VEHICLE AUTOMATIC SOUND VOLUME ADJUSTING APPARATUS

BACKGROUND OF THE INVENTION

1. Field of the Invention

The present invention relates to an on-board vehicle automatic sound volume adjusting apparatus for use with on-board vehicle stereo equipment.

2. Description of the Related Art

Inside a running vehicle, the running noise masks the sound reproduced by speakers of on-board vehicle stereo equipment, with the result that the sound volume is perceived lower than the actually reproduced volume level. This impediment to satisfactory listening is conventionally circumvented by an automatic sound volume adjusting apparatus which the automatically adjusts the sound volume level in response to the running noise level being detected inside the vehicle.

With such prior art on-board vehicle automatic sound volume adjusting apparatus, as shown in FIG. 1, an input audio signal supplied from the signal source such as a cassette deck, not shown, is output via an electronic rheostat 5 (i.e., VCA). The input audio signal level is detected by a signal detection circuit 1. The output signal level of a microphone 2 that picks up the running noise is detected by a noise detection circuit 3. The difference in output signal level between signal detection circuit 1 and noise detection circuit 3 is detected by a subtracter 4. An output signal from the subtracter 4 becomes a control signal of the electronic rheostat 5. Thus, the level of attenuation electronic rheostat 5 is controlled in accordance with the control signal level.

With the prior art on-board vehicle automatic sound volume adjusting apparatus of the above-described construction, the level of attenuation of the electronic rheostat 5 is lowered as the running noise level is raised by increased vehicle speed. The sound volume level goes up accordingly. The higher the running noise level becomes, the greater the average volume of the reproduced sound from the speakers becomes. However, the reproduced sound volume being masked due to the running noise is lower than a minimum value "pp" shown in FIG. 2. At that minimum volume value, the masking is not canceled even as the sound volume levels goes up in response to the rising of the noise level. On the other hand, a maximum volume value "ff" of the reproduced sound is not masked by the running noise. Thus, there is a problem such that the sound volume becomes too high in response to a rise in the running noise level.

SUMMARY OF THE INVENTION

It is therefore an object of the present invention to provide an on-board vehicle automatic sound volume adjusting apparatus which inhibits masking at the minimum value of reproduced sound and which prevents the maximum value of the reproduced sound from becoming excessively high in response an increase in the running noise level.

In carrying out the invention, there is provided an on-board vehicle automatic sound volume adjusting apparatus which receives an audio signal and automatically adjusts the audio signal level in accordance with the interior noise level emanating from the running vehicle. The apparatus comprises means for generating a control signal in response to the input audio signal level and the running noise level, and means for compressing the amplitude of the audio signal depending on the control signal, the latter means being inserted into the audio signal input/output line.

DETAILED DESCRIPTION OF PREFERRED EMBODIMENTS

Figure 3:
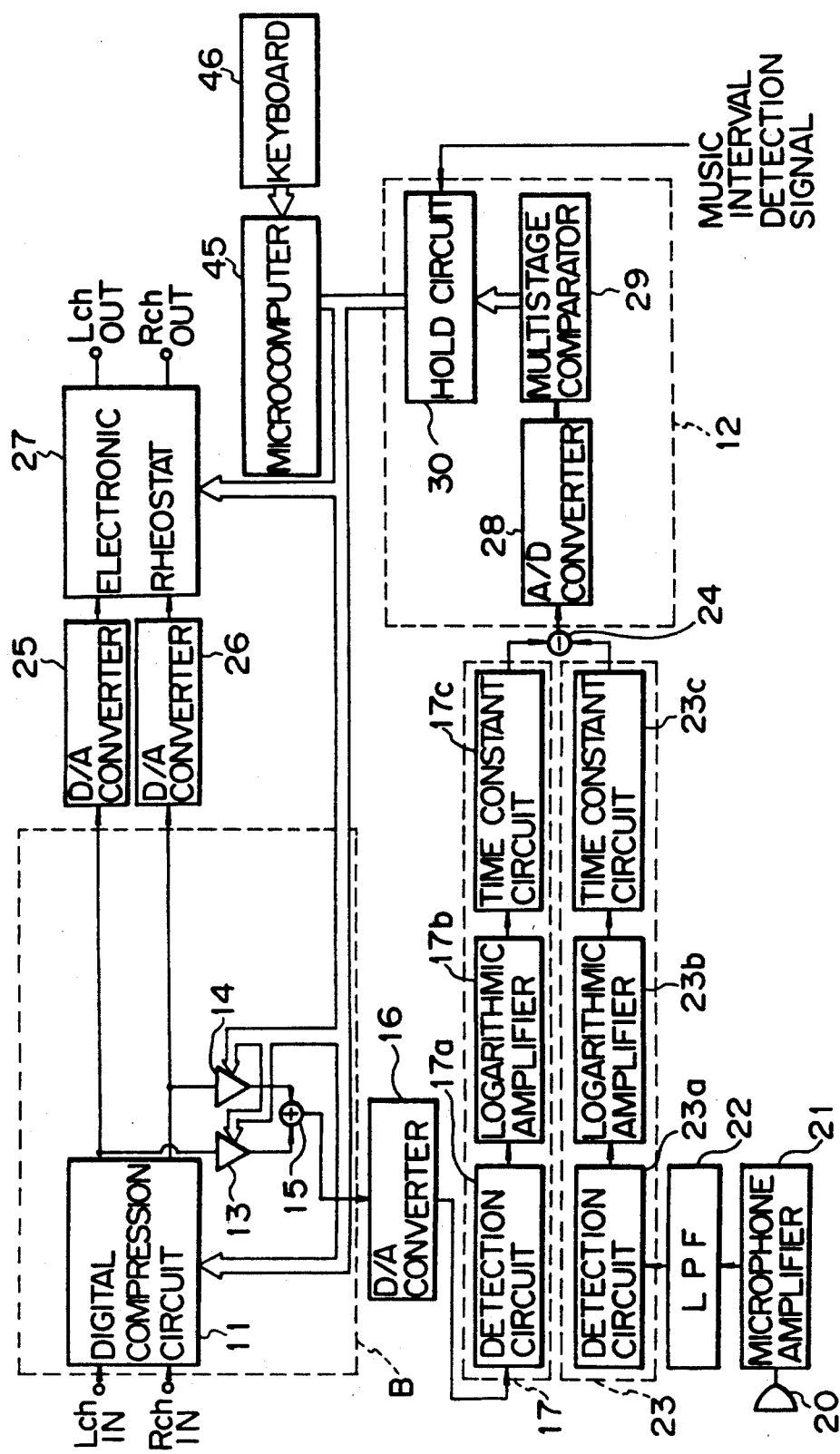
FIG. 3 is a block diagram of a first embodiment of the present invention.

FIG. 3 shows in block diagram format an on-board vehicle automatic sound volume adjusting apparatus as the first embodiment of the invention. In the apparatus, digital audio signals for the left and right channels are supplied to a digital compression circuit 11. The digital compression circuit 11 compresses the audio signals for left and right channels under control of a microcomputer 45 in response to a control signal from a control circuit 12. This construction will be described later in more detail. The left- and right-channel output terminals of the digital compression circuit 11 are connected to D/A converters 25 and 26, respectively. The D/A converters 25 and 26 convert the left- and right-channel digital signals from the digital compression circuit 11 into analog signals and supply an electronic rheostat 27 therewith. The left- and right-channel audio signals issued by the electronic rheostat 27 are the output signals of this apparatus.

Multipliers 13 and 14 each constitute an attenuator that varies its level of attenuation in response to a control signal from the microcomputer 45. That is, the level of attenuation of the multipliers 13 and 14 is varied in conjunction with the control of rheostat 27 given by the microcomputer 45 in response to the manual operation performed on a keyboard 46. The output terminals of the multipliers 13 and 14 are connected to a digital adder 15 where the signals therefrom are added. A digital signal issued from the adder 15 is converted to an analog signal by a D/A converter 16 before being supplied to a signal detection circuit 17. The signal detection circuit 17 comprises a detection circuit 17a, a logarithmic amplifier 17b and a time constant circuit 17c. The detection circuit 17a detects the input audio signal in order to obtain a DC signal. The logarithmic amplifier 17b converts to a logarithmic value the output signal from the detection circuit 17a. The time constant circuit 17c receives the output signal from the logarithmic amplifier 17b and forwards it using a predetermined time constant.

On the other hand, an output signal from a microphone 20 inside the vehicle is amplified by a microphone amplifier 21 before being supplied to a noise detection circuit 23 via an LPF 22. In a manner similar to the signal detection circuit 17, the noise detection circuit 23 also comprises a detection circuit 23a, a logarithmic amplifier 23b and a time constant circuit 23c. The outputs of the signal detection circuit 17 and noise detection 23 are connected to a subtracter 24. The output signal of the subtracter 24 is supplied to the control circuit 12.

As illustrated, the control circuit 12 includes an A/D converter 28 for converting the output signal of the subtracter 24 into a digital signal. The output value data from the A/D converter 28 is supplied to a multistage comparator 29 for comparison with a plurality of different reference values. The result of the comparison is held in a hold circuit 30. The signal issued by the hold circuit 30 becomes the control signal to be supplied to the microcomputer 45. An appropriate synchronization timing is maintained by suitable means, not shown, so that the A/D converter 28, multistage comparator 29 and hold circuit 30 are synchronized.

Figure 4:
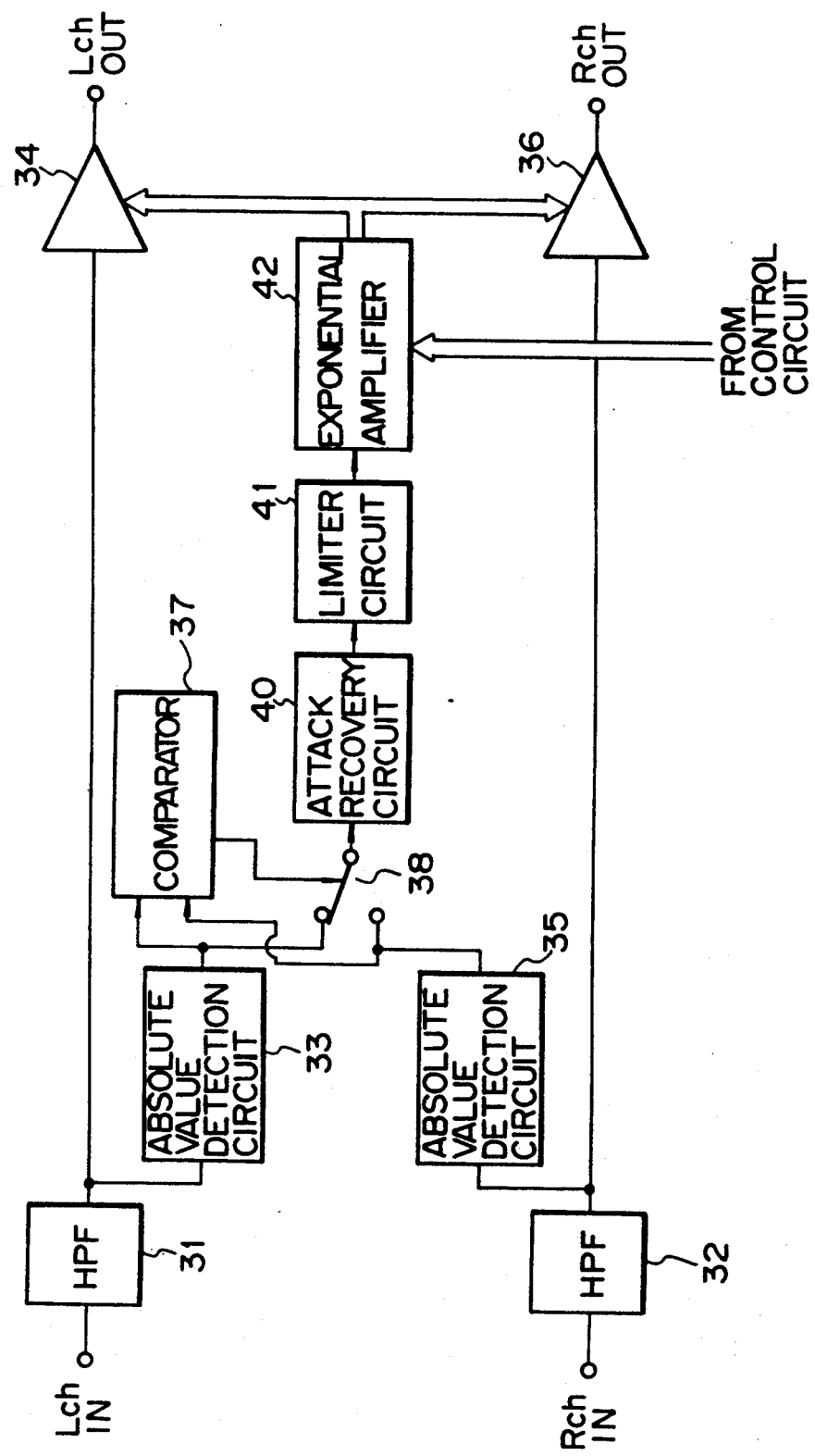
FIG. 4 is a block diagram specifically illustrating a digital compression circuit of the embodiment of FIG. 3.

As depicted in FIG. 4, the digital compression circuit 11 comprises in its input stage an HPF 31 for the left channel and an HPF 32 for the right channel. The HPFs 31 and 32 let pass those components from input digital audio signal which exceed a certain frequency such as 10 Hz so as to prevent malfunction caused by subsonic noise. The output terminal of the HPF 31 is connected to an absolute value detection circuit 33 and a multiplier 34. Likewise, the output terminal of the HPF 32 is connected to an absolute value detection circuit 35 and a multiplier 36. The output terminals of the absolute value detection circuits 33 and 35 are connected to a comparator 37 and a changeover switch 38. The comparator 37 compares absolute values detected by the absolute value detection circuits 33 and 35. The changeover switch 38 is operated in accordance with the result of the comparison. That is, if the absolute value detected by the absolute value detection circuit 33 is greater than the value coming from the absolute value detection circuit 35, the changeover switch 38 relays the absolute value from the circuit 33; if the absolute value from the absolute value detection circuit 35 is greater than the value from the absolute value detection circuit 33, the changeover switch 38 relays the absolute value detected by the circuit 35. The relayed output terminal of the changeover switch 38 is connected to an attack recovery circuit 40. The attack recovery circuit 40 furnishes the relayed output signal of the changeover switch 38 with a time constant of about a few microseconds when the signal is rising or with a time constant of about several hundreds of microseconds when the signal is falling. An exponential amplifier 42 is connected to the attack recovery circuit 40 via a limiter circuit 41. The limiter circuit 41 is provided so as to inhibit the compression operation on those components of the input signal which are equal to or below a predetermined level. The operation of the limiter circuit 41 will be described later in more detail. The exponential amplifier 42 functions as an exponential converter that exponentially converts signals using a power exponent presented by the microcomputer 45 on the basis of the control signal from the control circuit 12. The output signal of the exponential amplifier 42 varies a multiplication coefficient of the multipliers 34 and 36. This causes the output signals of the multipliers 34 and 36 to be output as compressed signals over the left and right channels, respectively.

In the above-described construction, the input digital audio signals on the left and right-channels are supplied to the multipliers 34 and 36 via the HPF 31 and 32, respectively. The multipliers 34 and 36 multiply supplied digital audio signals by the multiplication coefficient corresponding to the output signal from exponential amplifier 42. The output signals of the multipliers 34 and 36 are attenuated by the multipliers 13 and 14, respectively, before being added by the adder 15. The output from adder 15 is converted to an analog audio signal by the D/A converter 16, the analog audio signal being supplied to the signal detection circuit 17 whereby the audio signal level is detected.

On the other hand, the running noise perceived inside the vehicle is picked up by the microphone 20 is amplified by the microphone amplifier 21 before being supplied to the LPF 22. The LPF 22 lets pass only those components of the running noise signal which fall into a predetermined range (e.g., components 10 Hz or lower). The signal level of the running noise signal passed through the LPF 22 is detected by the noise detection circuit 23. The subtracter 24 detects the difference in detection level between signal detection circuit 17 and noise detection circuit 23. The level difference signal from the subtracter 24 is converted to a digital signal by the A/D converter 28 before being supplied to the multistage comparator 29. The multistage comparator 29 generates its control signal corresponding to the magnitude of the level difference signal through comparison with a plurality of reference values. Because the level difference signal rises in magnitude either as the detected level from the noise detection circuit 23 increases or as the detected level from the signal detection circuit 17 decreases, the control signal generated by the multistage comparator 29 lowers the level of attenuation of the electronic rheostat 27 while increasing the level of compression by the compression circuit 11.

Figure 1:
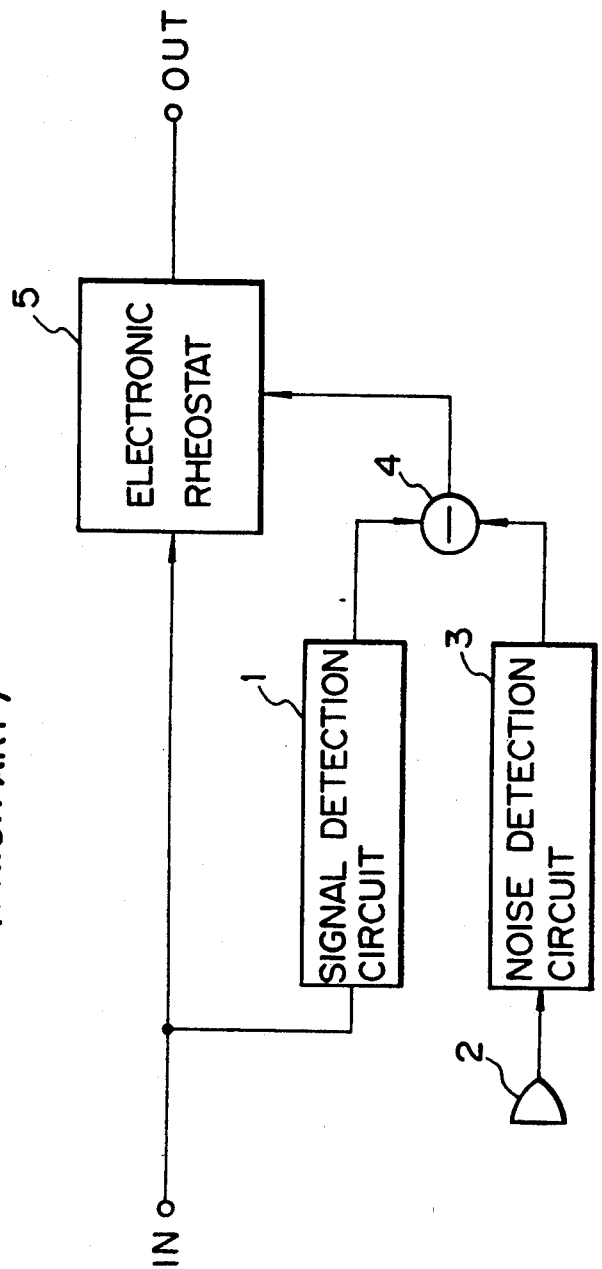
FIG. 1 is a block diagram showing a conventional on-board vehicle automatic sound volume adjusting apparatus.
Figure 2:
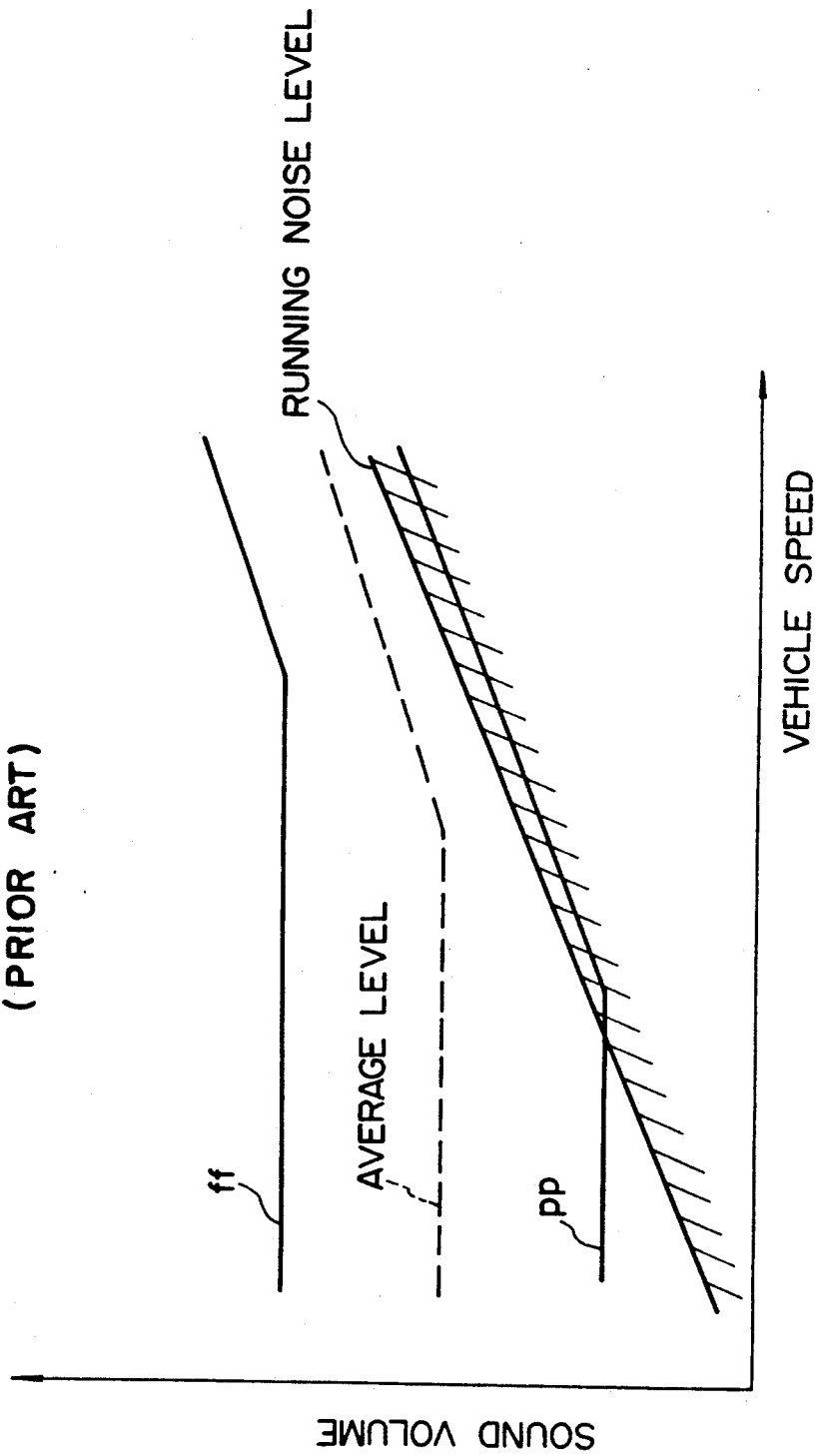
FIG. 2 is a view showing the relationship between reproduced sound volume and running noise on on-board vehicle stereo equipment to which the apparatus of FIG. 1 is applied.

That the level of attenuation of the electronic rheostat 27 varies with the control signal is also a feature of the prior art apparatus of FIG. 1. One novel feature of the on-board vehicle automatic sound volume adjusting apparatus according to the invention is that the value indicated by the control signal (control value) is converted to another value that matches the exponential conversion characteristic determined by the exponential amplifier 42.

If Vi (dB) stands for the audio signal supplied to the multipliers 34 and 36, and Vo (dB) for the audio signal generated therefrom, the following equation is obtained:

$$20 \log Vo = 20 \cdot a \log Vi + b \quad (1)$$

where, "a" and "b" are a variable each. The variable "a" is a value given in accordance with the control value from the control circuit 12. Equation (1) may be transformed into:

$$\log Vo = \log Vi^a + \log b' \quad (2)$$

where, log b' + b/20. Thus from equation (2), one gets:

$$Vo = Vi^a \cdot b' \quad (3)$$

Therefore, $$V_o/V_i = V_i^{a-1} \cdot b'  \quad (4)$$

Because of the compression involved, $a \leq 1$.

Figure 5:
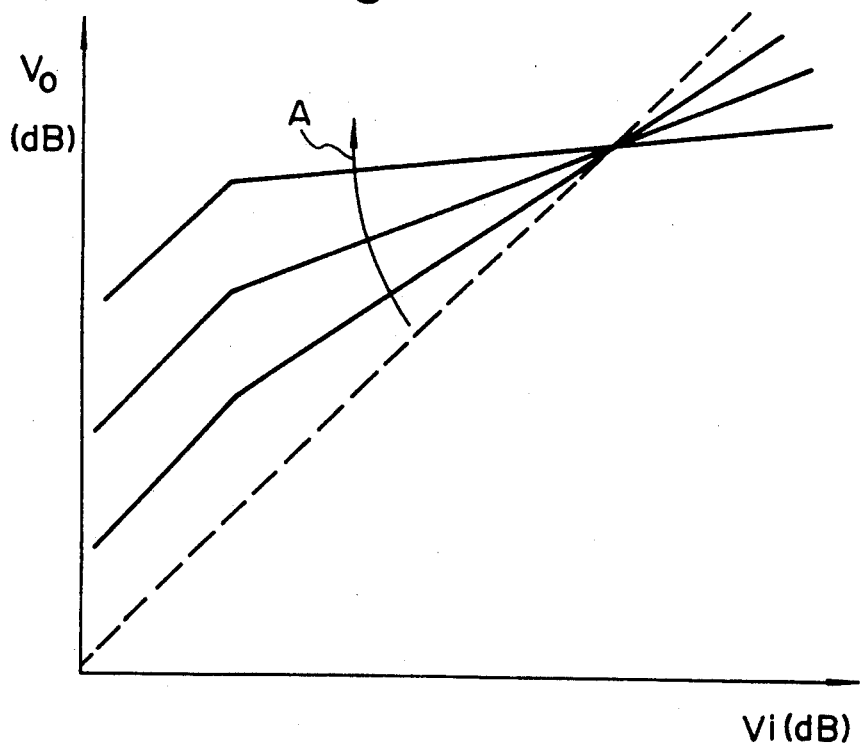
FIG. 5 is a view depicting the compression characteristic of the embodiment.

The exponential amplifier 42 receives an absolute value detection signal of the input audio signal from the limiter circuit 41. In turn, the exponential amplifier 42 supplies the multipliers 34 and 36 with the absolute value multiplied by $(a-1)$, the multiplied value being a signal indicating the multiplication coefficient for the two multipliers. Thus as shown in FIG. 5, an input audio signal Vi equal to or higher than a certain level has the corresponding input/output characteristic inclined in the arrowed direction A either as the running noise level is raised or as the audio signal level is lowered. In either case, the degree of compression is increased. As depicted, the point of intersection of the input/output characteristic variations are set so as to be approximately equal to the average level of the input audio signal. In FIG. 5, the broken line indicates the input/output characteristic in effect when no compression occurs. Where the absolute value is below a predetermined value, the limiter circuit 41 supplies the exponential amplifier 42 with a signal indicating the predetermined value as the absolute value detection signal. If the input audio signal Vi is below the predetermined value, no compression is provided and the input/output characteristic takes on a uniform inclination, as shown in FIG. 5.

Figure 6:
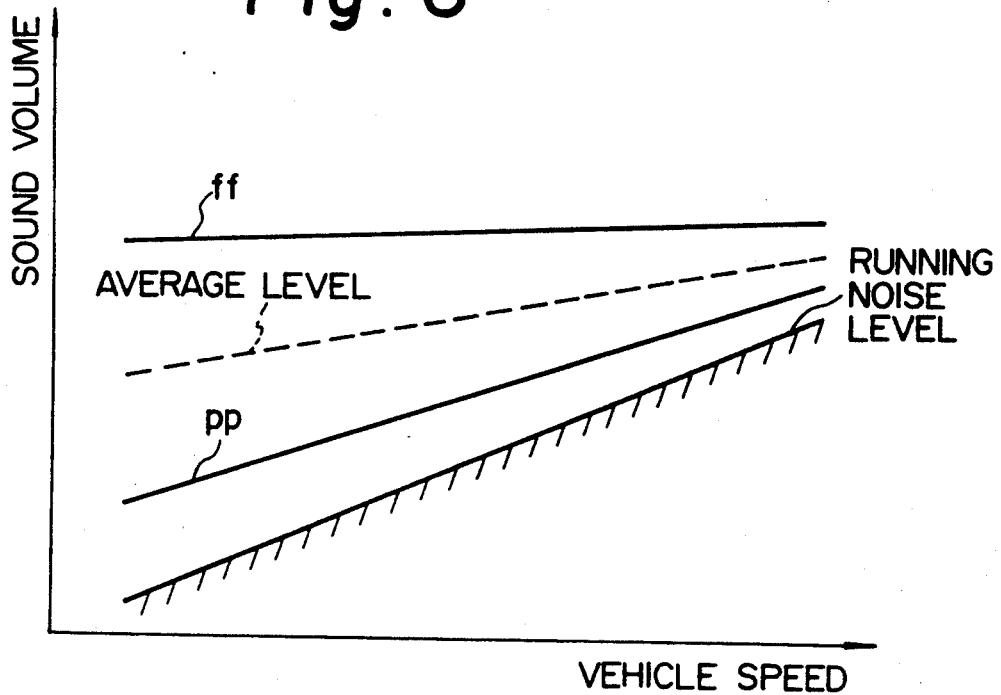
FIG. 6 is a view illustrating the relationship between reproduced sound volume and running noise in on-board vehicle stereo equipment to which the embodiment is applied.

In FIG. 6, when the running noise is raised on a vehicle running at increasingly high speeds, the compression circuit 11 functions as described to let the average level (broken line) of the reproduced sound volume rise just as with the prior art. However, as the running noise level is raised, the amplitude between minimum value "pp" and maximum value "ff," or the so-called dynamic range, is reduced. For example, no compression takes place when the vehicle is stopped; when the vehicle is running at 100 km/h or higher, the dynamic range is reduced to a half of what it is with the vehicle stopped. Because the minimum value "pp" of the reproduced sound volume goes up at a rate higher than the average level, the minimum value is not masked by the running noise; because the maximum value "ff" of the reproduced sound volume rises at a rate lower than the average level, the maximum value is not raised excessively.

The hold circuit 30 holds the control signal in effect immediately before a music interval detection signal that may be received from a music interval detecting means, not shown. This feature reduces the overall audio signal level at music intervals. With the control value kept from becoming larger if the running noise is high, the music interval noise remains inconspicuous. Alternatively, the control value may be set for the initial value in the above case.

Figure 7:
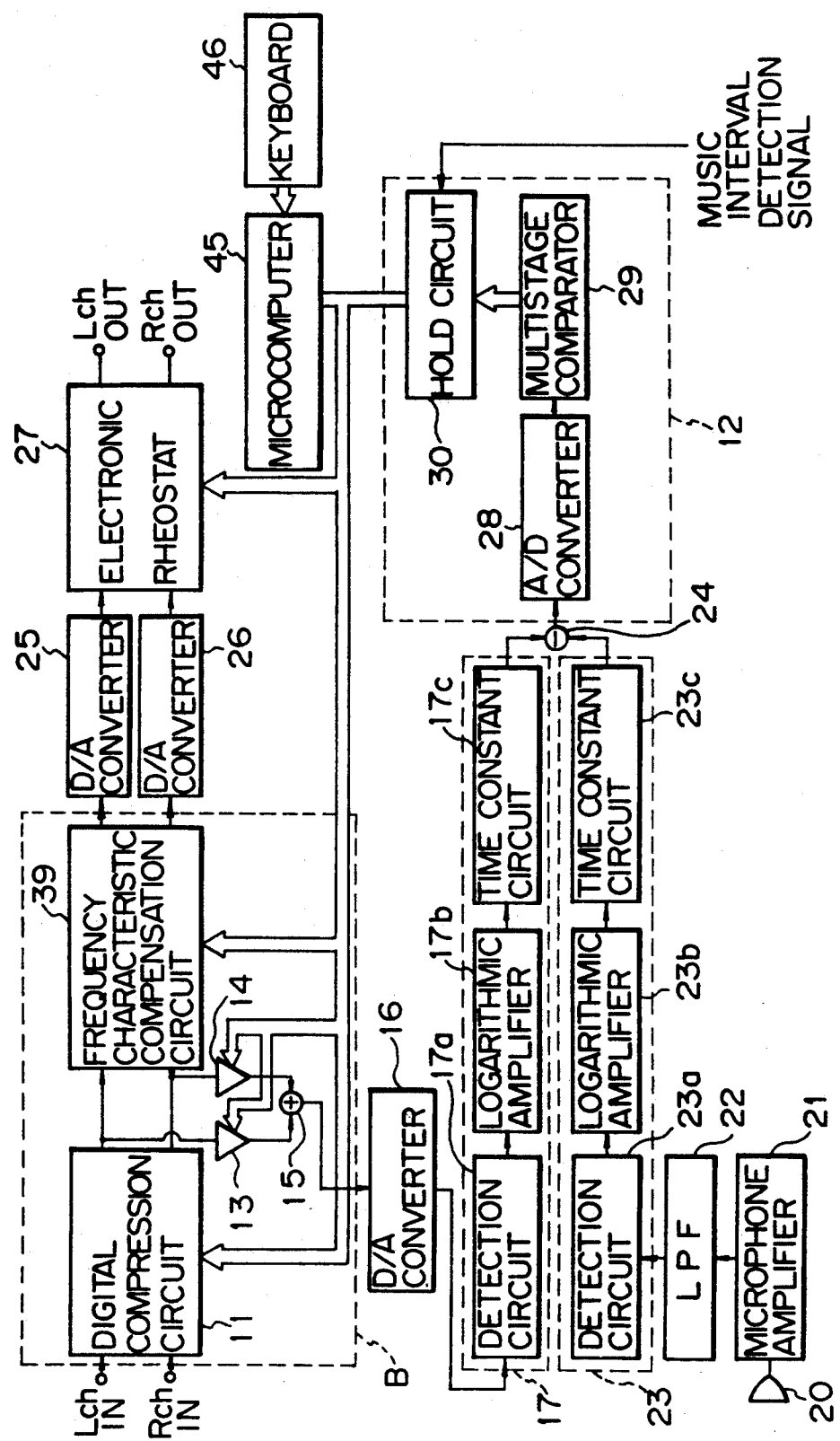
FIG. 7 is a block diagram of a second embodiment of the invention.

In the above-described first embodiment, the sound volume is raised or lowered by detecting the running noise and the exponentially converted audio signal. In a second embodiment whose block diagram is shown in FIG. 7, a frequency characteristic compensation circuit 39 is inserted into the signal path downstream of the point of detection by the multipliers 13 and 14. In response to the control signal coming from the control circuit 12 via the microcomputer 45, both the frequency characteristic compensation circuit 39 and the electronic rheostat 27, or the frequency characteristic compensation circuit 39 alone is operated to compensate changes in the sound quality while the vehicle is running. The compensation is available because the running noise has a spectrum lopsided onto the low-pass component side and because the amount of masking of the audio signal by the running noise varies with the frequency.

Figure 8:
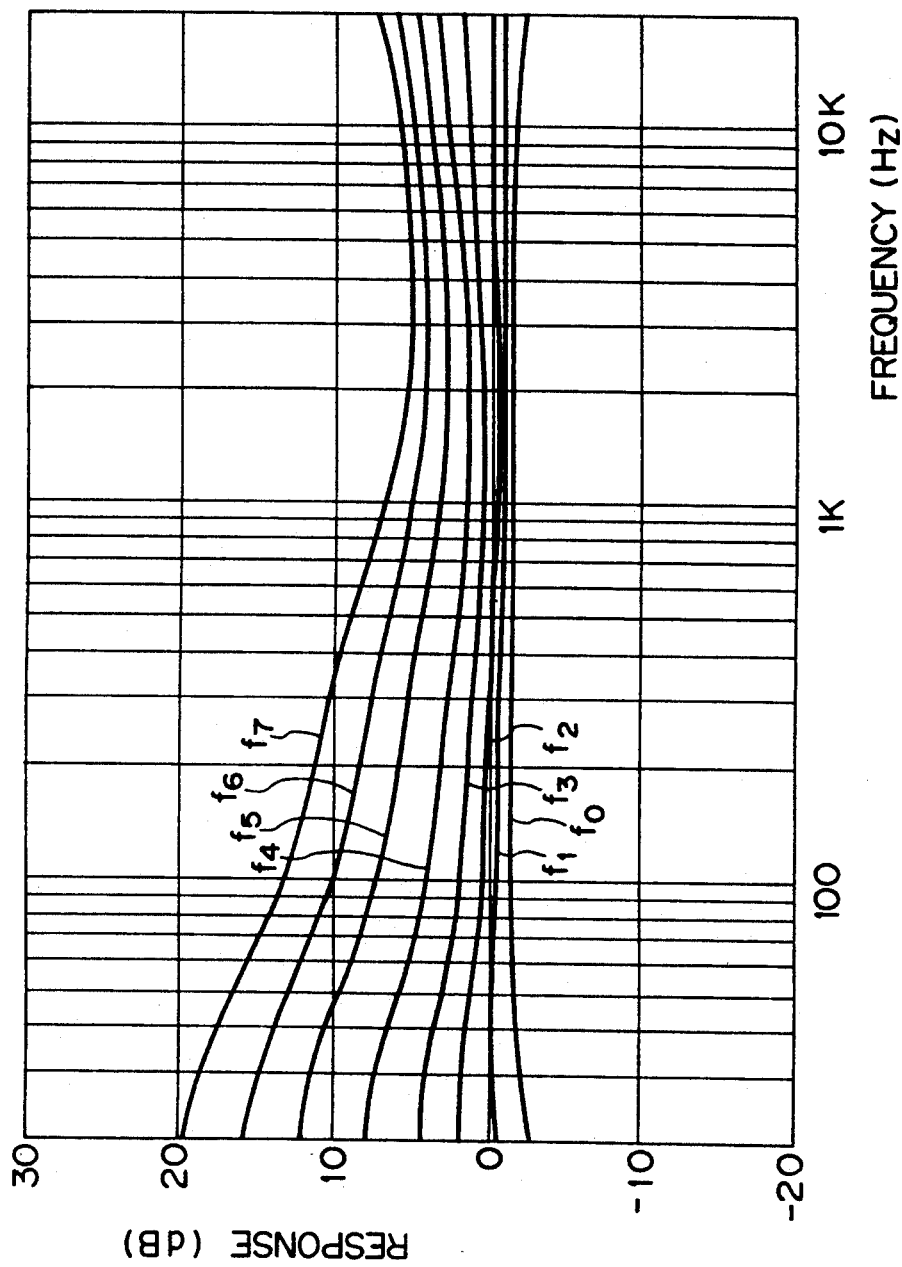
FIG. 8 is a view depicting the frequency characteristic of a frequency characteristic compensation circuit in the second embodiment.

The frequency characteristic compensation circuit 39 varies the frequency characteristic in accordance with the value represented by the control signal via the microcomputer 45. For example, eight frequency characteristic variations $f_0$ through $f_7$ are provided beforehand as shown in FIG. 8. As the control value becomes larger, the frequency characteristic is switched sequentially from $f_0$ on. This compensates the frequency characteristic of the left- and right-channel audio signals compressed by the compression circuit 11.

In the second embodiment described above, the digital compression circuit 11 and frequency characteristic compression circuit 39 are each made up of various physical circuits. Alternatively, the circuits 11 and 39 may be replaced by the operations carried out by a DSP (digital signal processor) enclosed by broken line B in FIG. 3.

As described, the on-board vehicle automatic sound volume adjusting apparatus according to the invention adjusts the input audio signal level in accordance with the difference between the input audio signal level and the running noise level inside the vehicle. The apparatus also compress the input audio signal for output in accordance with that level difference. Thus, the dynamic range is reduced as the running noise level goes up, as depicted in FIG. 6. Therefore, the masking of the minimum component of the reproduced sound volume is inhibited, while the maximum component of the reproduced sound volume is prevented from becoming excessive when the running noise level is raised.

It is to be understood that while the invention has been described in conjunction with specific embodiments, it is evident that many alternatives, modifications and variations will become apparent to those skilled in the art in light of the foregoing description. Accordingly, it is intended that the present invention embrace all such alternatives, modifications and variations as fall with the spirit and scope of the appended claims.

What is claimed is:

1. An on-board vehicle automatic sound volume adjusting apparatus for receiving an audio signal and automatically adjusting the level of said audio signal in accordance with a running noise level detected inside said vehicle, said apparatus comprising:

control means for generating a control signal in response to a difference value between an audio signal level derived from an audio input and said running noise level; and compressing means provided in an input/output line of said audio signal for detecting an absolute value of said audio signal level and for compressing the amplitude of said audio signal at a degree corresponding to said control signal and said absolute value.

2. An on-board vehicle automatic sound volume adjusting apparatus according to claim 1, further comprising an electronic means for automatically adjusting said audio signal level in response to said control signal.

3. An on-board vehicle automatic sound volume adjusting apparatus according to claim 1, where said control means includes:

first detecting means for detecting said audio signal level;

second detecting means for detecting said running noise level inside said vehicle;

subtracting means for detecting a level difference between the levels detected by said first and second detecting means; and comparing means for comparing said level difference with a plurality of reference values and for outputting as said control signal a signal indicating the result of said comparison.

4. An on-board vehicle automatic sound volume adjusting apparatus according to claim 1, wherein said compressing means includes:

absolute value detecting means for detecting the absolute value of said audio input;

limiter means responsive to an output from said absolute value detecting means for providing, as an output value, said absolute value of said audio signal, and when said absolute value is not higher than a predetermined value, rendering said output value equal to said predetermined value;

exponential conversion means for exponentially converting the output value from said limiter means in accordance with said control signal; and multiplying means for multiplying said audio input by the output value from said exponential conversion means.

5. An on-board vehicle automatic sound volume adjusting apparatus according to claim 1, further comprising a frequency characteristic compensation circuit for compensating the frequency characteristic of said audio signal downstream of said compressing means in accordance with said control signal.

* * * * *